United States Patent
Tunga et al.

(10) Patent No.: US 9,947,598 B1
(45) Date of Patent: Apr. 17, 2018

(54) DETERMINING CRACKSTOP STRENGTH OF INTEGRATED CIRCUIT ASSEMBLY AT THE WAFER LEVEL

(71) Applicant: International Business Machines Corporation, Armonk, NY (US)

(72) Inventors: Krishna R. Tunga, Wappingers Falls, NY (US); Karen P. McLaughlin, Poughkeepsie, NY (US); Charles L. Arvin, Poughkeepsie, NY (US); Brian R. Sundlof, Verbank, NY (US); Steven P. Ostrander, Poughkeepsie, NY (US); Christopher D. Muzzy, Burlington, VT (US); Thomas A. Wassick, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/634,237

(22) Filed: Jun. 27, 2017

(51) Int. Cl.
*H01L 21/66* (2006.01)
*H01L 23/58* (2006.01)
*H01L 21/78* (2006.01)

(52) U.S. Cl.
CPC .............. *H01L 22/12* (2013.01); *H01L 21/78* (2013.01); *H01L 23/585* (2013.01)

(58) Field of Classification Search
USPC .......................................................... 438/14
See application file for complete search history.

(56) References Cited

U.S. PATENT DOCUMENTS

| | | |
|---|---|---|
| 6,372,661 B1 | 4/2002 | Lin |
| 7,098,676 B2 | 8/2006 | Landers |
| 7,683,627 B2 | 3/2010 | Tsukuda |
| 7,863,917 B2 | 1/2011 | Park |
| 7,889,840 B2 | 2/2011 | Vasudevan |
| 8,440,505 B2 | 5/2013 | Kulkarni |
| 8,575,723 B2 | 11/2013 | Tschmelitsch |
| 8,937,009 B2 * | 1/2015 | Daubenspeck ......... H01L 24/11 257/48 |

(Continued)

OTHER PUBLICATIONS

Cho et al., "Chip package interaction for advanced nodes: a holistic approach for foundries and OSATs", Chip Scale Review, Nov.-Dec. 2015, 5 pages.

*Primary Examiner* — Marcos D Pizarro
*Assistant Examiner* — Lawrence Tynes, Jr.
(74) *Attorney, Agent, or Firm* — David B. Woycechowsky

(57) ABSTRACT

A methodology and associated wafer level assembly of testing crackstop structure designs. The wafer level semiconductor assembly includes: a substrate structure shaped to define a set of horizontal directions; a metallization layer located on top of the substrate structure, with the metallization layer including a crackstop structure formed therein in accordance with a crackstop structure design; and a tensioned layer located on top of the metallization layer, with the tensioned layer being made of material having internal tensile forces oriented in the horizontal directions. The tensile forces promote horizontal direction crack propagation in the metallization layer so that the crackstop structure design can be tested more rigorously and reliably before deciding on the crackstop design structure to put into mass production (which mass produced product would typically not include the tensioned layer).

20 Claims, 6 Drawing Sheets

(56) References Cited

U.S. PATENT DOCUMENTS

| | | | |
|---|---|---|---|
| 2004/0129938 A1* | 7/2004 | Landers | H01L 22/34 257/48 |
| 2005/0170104 A1 | 8/2005 | Jung | |
| 2008/0277765 A1* | 11/2008 | Lane | H01L 21/563 257/622 |
| 2010/0012950 A1* | 1/2010 | Liu | H01L 23/585 257/77 |
| 2013/0009663 A1 | 1/2013 | Gauch | |
| 2014/0264767 A1* | 9/2014 | Gratz | H01L 21/78 257/620 |
| 2015/0258769 A1* | 9/2015 | Farah | C30B 29/42 156/711 |
| 2017/0162501 A1* | 6/2017 | Yi | H01L 23/5226 |

* cited by examiner

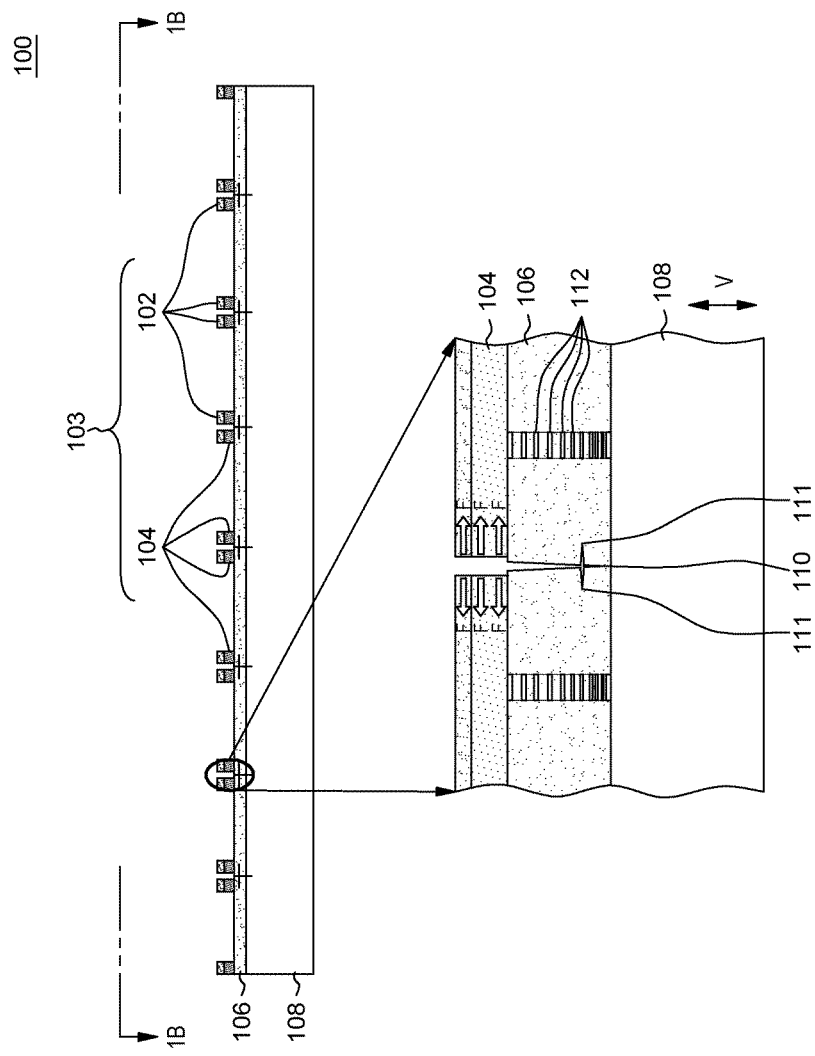

| Ni FRAME WIDTH (um) | Ni THICKNESS (um) | PBO | # DIES TOTAL | # OPENS | % FAIL |
| --- | --- | --- | --- | --- | --- |
| 130 | 20 | YES | 32 | 4 | 12.50% |
| 130 | 10 | YES | 32 | 1 | 3.10% |
| 70 | 20 | YES | 30 | 0 | 0% |
| 70 | 10 | YES | 30 | 0 | 0% |
| 130 | 20 | NO | 64 | 0 | 0% |
| 130 | 10 | NO | 32 | 0 | 0% |
| 70 | 20 | NO | 60 | 0 | 0% |
| 70 | 10 | NO | 30 | 0 | 0% |

DETERMINING CRACKSTOP STRENGTH OF INTEGRATED CIRCUIT ASSEMBLY AT THE WAFER LEVEL

BACKGROUND

The present invention relates generally to the field of testing the quality and reliability of semiconductor chip assemblies (for example, wafer level semiconductor assemblies), and more particularly to testing the crackstop robustness of semiconductor assemblies.

Metallization layers are usually the top-most layers of semiconductor devices. The manufacturing of semiconductor devices is typically classified into two phases: the front end of line (FEOL) and the back end of line (BEOL). The BEOL phase starts at the point of the manufacturing process where metallization layers are formed. During the BEOL phase of manufacture of integrated circuit chips: (i) an intermediate sub-assembly, called a wafer (sometimes herein, a wafer level semiconductor assembly) is formed; (ii) the wafer undergoes laser scribing which introduces and/or propagates vertical and horizontal cracks; and (iii) the wafer level semiconductor assembly is "diced" (for example, by "die sawing") to separate portions of the wafer to yield stock (herein referred to as "unprocessed chip assemblies") for multiple integrated circuit chips. The layers of the chip formed during the BEOL phase are sometimes herein referred to as "BEOL layers." The unprocessed chip assemblies are typically subjected to further processing steps, (for example, packaging processing).

As mentioned above, the laser scribing or dicing processes can generate cracks that can damage active areas of the unprocessed chip assemblies yielded by the dicing. To prevent such damage by stopping the propagation of cracks, various kinds of structures are known to be used (for example, crackstop layers) at the perimeter locations of each chip within a wafer.

SUMMARY

According to an aspect of the invention, there is a method of testing crackstop structure designs. The method includes the following operations (not necessarily in the following order): (i) providing a set of prototype wafer level semiconductor assembly(ies), with each wafer level semiconductor assembly including: a substrate structure shaped to define a set of horizontal directions, a metallization layer located on top of the substrate structure, with the metallization layer including a crackstop structure formed therein in accordance with a first crackstop structure design, and a tensioned layer located on top of the metallization layer, with the tensioned layer being made of material having internal tensile forces oriented in the horizontal directions (or in-plane direction of the wafer); (ii) laser scribing each wafer level semiconductor assembly to initiate and propagate cracks in the horizontal directions, with the crack propagation being assisted by the horizontal tensile forces of the tensioned layer; and (iii) inspecting crack propagation in each wafer level assembly to determine whether the first crackstop structure design provides an acceptable level of crack suppression.

According to a further aspect of the present invention, a wafer level semiconductor assembly includes: a substrate structure shaped to define a set of horizontal directions; a metallization layer located on top of the substrate structure, with the metallization layer including a crackstop structure formed therein in accordance with a first crackstop structure design; and a tensioned layer located on top of the metallization layer, with the tensioned layer being made of material having internal tensile forces oriented in the horizontal directions.

According to a further aspect of the present invention, there is a method of making a prototype wafer level semiconductor assembly. The method includes the following operations (not necessarily in the following order): (i) providing a substrate structure shaped to define a set of horizontal directions; (ii) forming a metallization layer on top of the substrate structure, with the metallization layer including a crackstop structure formed therein in accordance with a first crackstop structure design; and (iii) forming a tensioned layer located on top of the metallization layer, with the tensioned layer being made of material having internal tensile forces oriented in the horizontal directions.

BRIEF DESCRIPTION OF THE DRAWINGS

FIG. 1A is a cross-sectional view of a first embodiment of a semiconductor wafer assembly after laser scribing according to the present invention;

FIG. 2 is a table showing experimental results related to the first embodiment semiconductor wafer assembly;

DETAILED DESCRIPTION

Figure 1B:
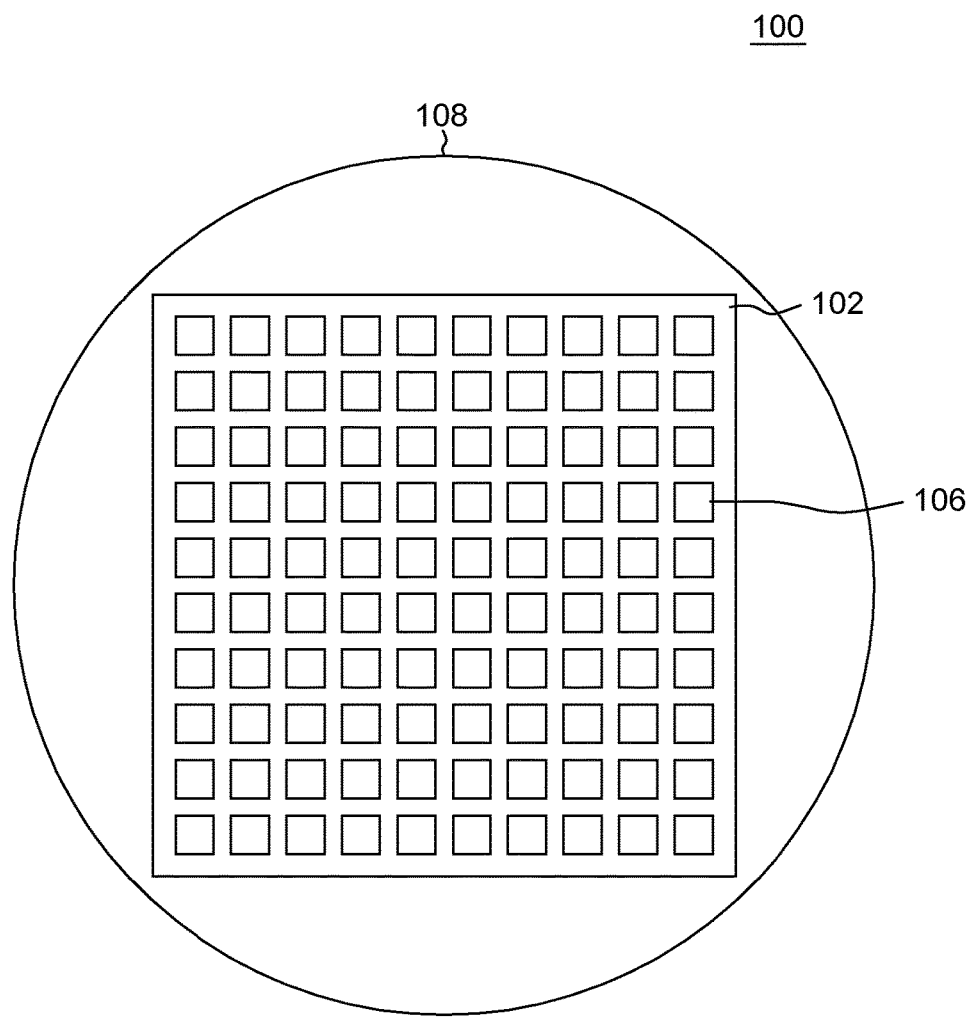
FIG. 1B is a plan view of the first embodiment semiconductor wafer assembly.

Some embodiments of the present invention are directed to use of a tensioned layer (in some embodiments including multiple sub-layers) in a semiconductor wafer assembly. The tensioned layer induces horizontal plane direction crack propagation in other layer(s) of the semiconductor wafer assembly in order to help test the effectiveness and/or integrity of crackstop structure(s) integrated into the semiconductor wafer assembly. In some embodiments, the tensioned layer is only used in prototype wafers to determine crackstop sufficiency of the wafer assembly design, and the tensioned layer is not present in actual production wafers.

Some embodiments of the present invention may include one, or more, of the following features, characteristics, operations and/or advantages: (i) generating local crack-driving forces within the BEOL by depositing tensile film and/or coating on the front side (that is, the top side as shown in cross-sectional views herein) of the wafer; (ii) the deposited film/coating (sometimes herein referred to as the "tensioned layer") is patterned and confined to a limited region surrounding the laser scribe; (iii) the described methodology only accelerates the horizontal cracks within the BEOL and not the vertical cracks within the bulk silicon; (iv) patterning of the deposited film/coating only around the chip edge region allows wafer level probing and monitoring for failures during testing; and/or (v) accelerated determination of weak crackstop/BEOL at an earlier wafer level stage will: (a) help in adopting chip design/fabrication process changes to rectify weak crackstop/BEOL design early in the product cycle thereby reducing qualification time and costs, and/or (b) reduce unnecessary BA (that is, Bond and Assembly, which is a process where the chip is assembled on a substrate and bonded) and capping related costs that could have incurred due to chips having defective crackstop/BEOL.

Some embodiments of the present invention may include one, or more, of the following features, characteristics, operations and/or advantages: (i) interrogating an entire length of a crackstop portion of each die on a wafer (for example, 5000 μm to 29000 μm of crackstop length (even though length is often expressed in units of mm (millimeters) it is here expressed in units of microns), depending on the chip size (crackstops can also be as low as 5 um wide); (ii) does not require modification of any structures located within the BEOL layers of the chip; (iii) includes a patterned film/metal deposition structure that is deposited on top of the finished wafer BEOL stack to accelerate the crack propagation within the BEOL layers of the chip and the crackstop; (iv) a method to interrogate semiconductor chip crackstop robustness that permits: (a) a method to test multiple dies at the wafer level, (b) a method to test for horizontal cracks, under a similar stress state to that which would occur in the packaged application, and/or (c) a method to induce suitable crack driving force (horizontal) in T&H humidity stress testing at the wafer level, and without the need for packaging; (v) is applicable to various semiconductor die structures such as a traditional, separate stitch or serpentine crack detection circuit inside the crackstop region; (vi) deposition of patterned film layers with residual tensile stress around the periphery of the chip at the wafer level; (vii) use of patterned film layers (sometimes herein referred to as a "patterned structure") to induce proper stress(es) to drive cracks and test the crackstop robustness of a semiconductor chip (again, at the wafer level) under simulated packaging stress and under typical reliability stress conditions (for example, T&H testing); (viii) the patterned structure helps to drive cracks within the BEOL layers of the chip; and/or (ix) use of patterned structure to improve testing of crackstop robustness of a semiconductor chip at the wafer level, under simulated packaging stress and under typical reliability stress conditions (for example, T&H testing).

Some embodiments of the present invention may include one, or more, of the following features, characteristics, operations and/or advantages: (i) a method to test multiple dies at the wafer level; (ii) a method to test for horizontal cracks, under a similar stress state to that which would occur in the packaged application; (iii) a method to induce suitable crack driving force (horizontal) in T&H humidity stress testing at the wafer level, and without the need for packaging; (iv) providing a patterned film structure deposited on the silicon wafer that does not necessarily help for prediction purposes, but, rather, helps in accelerating the failure rate of the crackstop located within the BEOL layers of the chip, which, in turn, helps to interrogate semiconductor chip crackstop robustness; (v) provides a passivation layer (also called a protection film sublayer) deposited outside (that is, outside in the vertical direction) the BEOL layers of the chip on top of the wafer; (vi) the passivation layer is deposited such that it has a residual tensile stress at test temperature and helps accelerate the failure rate of cracks located within the BEOL of the chip for testing purposes; (vii) the passivation layer is patterned in such a way to allow electrical probing and has a residual tensile stresses at the testing temperature of the wafer; (viii) uses a patterned structure, made of polyimide, aluminum or any other material with residual tensile stress, that is deposited on the wafer to accelerate the propagation of cracks located in the BEOL layers of the chip; (ix) a passivation or a metal layer is deposited on top of the wafer (and not within the chip); and/or (x) the passivation or metal layer is patterned and has a residual stress during testing.

Some embodiments of the present invention may include one, or more, of the following features, characteristics, operations and/or advantages: (i) a method for testing crackstop strength on a semiconductor wafer including the following operations (not necessarily in the following order): (a) depositing a tensile film on the top/front side of the wafer, and (b) patterning the film around the chip edge region of the wafer; (ii) a wafer with patterned metal and/or polymer layers deposited around the edges of each dies in a frame-like fashion and with at least one layer having a tensile residual stress at the testing temperature; (iii) the frame has cuts or breaks along the longitudinal direction of the edge; (iv) the width of the frame is greater than the distance between the diced edge of the die to the crackstop; and/or (v) the total thickness of the frame is less than 50 μm.

Some embodiments of the present invention may recognize the following facts, problems and/or opportunities for improvement with respect to the state of the art: (i) horizontal and vertical cracks are created within the BEOL due to the laser scribing process; (ii) horizontal cracks remain in the die even after BA and capping; (iii) these cracks could propagate and reach the crackstop during stressing (temperature and humidity testing (T&H), thermal cycling, DTC (that is, deep thermal cycling, for example, cycling between −40 C (or −55 C) and 125 C), etc.); (iv) crackstops are designed to have a high critical energy release rate (ERR) and therefore helps in arresting the propagation of cracks within the BEOL layers; (v) crackstops could weaken due to various reasons and this poses problems; (vi) crackstops could be weak or could become weak due to several factors (for example, improper crackstop design, improper material choice, fabrication process, moisture ingress, etc.) and might be ineffective in arresting the crack propagation; (vii) no methods are conventionally available to determine the decrease in effectiveness of the crackstop and to determine BEOL integrity at the wafer level; and/or (viii) there is a need to determine the strength of the crackstop (compared to known good wafer) and the weakest region within the crackstop at the wafer level in a time and resource efficient manner.

Crackstops could weaken due to various factors such as—improper crackstop design, improper material choice, fabrication process, moisture ingress etc—and might be ineffective in arresting the crack propagation. Currently, there are no methods available to determine the decrease in effectiveness of the crackstop and to determine BEOL integrity at the wafer level.

FIGS. 1A,1B show semiconductor wafer assembly 100. Unlike what is shown in the somewhat schematized view of FIG. 1B, it is noted that in some embodiments, the chips will cover substantially the entire circular area of the wafer. As those of skill in the art will appreciate, the view of FIG. 1B is not drawn to scale. Assembly includes: tensioned layer 103 (including patterned PBO film sublayer 102 and patterned Ni (nickel) sublayer 104; metallization layer (sometimes also referred to as BEOL layer) 106; silicon wafer substrate layer 108; and crackstop 112. It is noted that some embodiments of the present invention may use different materials for the tensioned layer and may use fewer, or more, sublayers in the tensioned layer. Some embodiments of the present invention have either one or two tensile layers. In embodiments where the crackstop is very strong and has a high fracture toughness, then the inclusion of two tensioned layers may help generate sufficient force to propagate the horizontal cracks. Crackstop 112 is located within BEOL layer 106, as shown in FIG. 1A. In this embodiment, PBO film sublayer, is a specific example of what is herein more generically referred to as a "protection film sublayer," "protection sublayer," "passivation film sublayer," or "passivation sublayer." A protection film sublayer protects the layers that underlie it from environmental contamination, as well as providing tension forces in the plane of the wafer. As will be appreciated by those of skill in the art, protection film sublayers may be made from materials other than PBO, such as PSPI (photosensitive polyimide) material.

After BEOL layer 106 is formed by metallization (according to any method now conventional or to be developed in the future), tensioned layer 103 is formed by deposition, coating and/or any layer formation process now known or to be developed in the future. Tensioned layer 103 is formed in such a manner that it includes internal tensile stresses as shown by arrows F in FIG. 1A. In this embodiment, pulse electroplating process is used to create tension in the patterned Ni sublayer, and causes this sublayer to be in tension by the nature of the electroplating process. In this embodiment, the patterned PBO sublayer is cured at a higher temperature (generally above 200 C) so that when the test is performed at lower temperatures, the film contracts and is in tension. Cracks typically form soon after the laser scribing process. Laser scribing is done after tensioned layer 103 is deposited. If the tensioned layer is not deposited on the wafer and the laser scribing is done without this layer, cracks can still form within the BEOL. However, the horizontal cracks thus generated may not propagate sufficiently to test the crackstop because there would be no driving force from any tensioned layer.

As shown in the detail portion of FIG. 1A, a BEOL layer crack includes a vertical portion 110, running in the vertical direction, and horizontal portions 111. Tensioned layer 103 generates local stresses, in the direction of opposing arrows F, near the horizontal portion 111 of the BEOL crack (see FIG. 1A at the detail view, with the vertical direction being shown by arrow V). These local stresses will increase the ERR within the horizontal portion 111 of the BEOL crack (by applying load similar to a Mode 2 crack) and thereby increases the rate of propagation of the horizontal crack portion 111. In assembly 100, the combined thickness of tensioned layer 103 has been designed to be relatively small (for example, <50 μm) in order to prevent the vertical crack from propagating. Tensioned layer 103 is patterned and confined to a limited region surrounding the laser scribe (<1 mm) to allow probing and/or electrical testing at the wafer level. As shown in FIG. 1A, there is a gap in tensioned layer 103 (for scale reasons, these gaps are not shown in the plan view of FIG. 1B) over the center of the interstitial zone between chip active areas. This gap is sometimes herein called a "perforation." The perforations are believed to promote crack propagation in the vertical directions.

Figure 3:
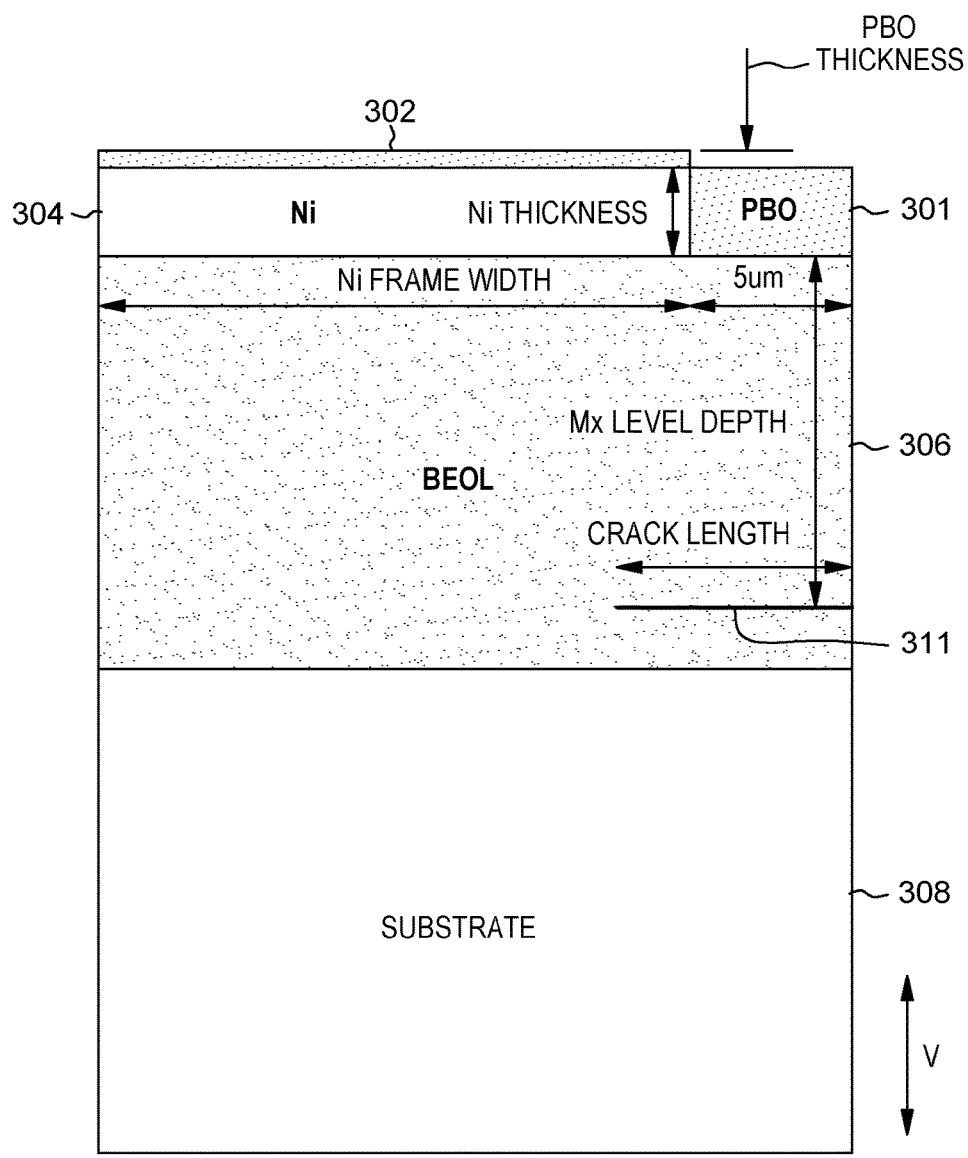
FIG. 3 is a cross-sectional view of a local region around the crackstop in a second embodiment of a semiconductor wafer assembly after laser scribing according to the present invention.

FIG. 3 show semiconductor wafer assembly including: vertical-crack-zone PBO sublayer 301; patterned PBO film sublayer 302; patterned Ni (nickel) sublayer 304; metallization layer (sometimes also referred to as BEOL layer) 306; silicon wafer substrate layer 308; and horizontal crack 311. The crackstop is not shown in FIG. 3, but is similar to the crackstop structure of embodiment 100. In this embodiment, the tensioned layer includes sublayers 301, 302 and 304. Vertical-crack-zone PBO sublayer 301 and patterned PBO film sublayer 302 are examples of protection sublayers that protect underlying sublayers and structures from environmental contamination. As mentioned above, protection sublayers, such as sublayers 301 and 302, may be made from materials other than PBO. Assembly 300 is different than assembly 100 because of the inclusion of vertical-crack-zone PBO sublayer 301 as part of the tensioned layer. Also, because of the inclusion of vertical-crack-zone PBO sublayer 301 as part of the tensioned layer, there are no "perforations" in this embodiment. More specifically, a "perforation" is used herein to refer to embodiments that have gaps that extend through the tensioned layer, but the inclusion of vertical-crack-zone PBO sublayer in this embodiment makes the tensioned layer substantially continuous over the plane of the wafer. However, the discontinuity of the patterned Ni sublayer over the vertical crack zone does still distribute tensile forces in a way that allows vertical crack propagation in between crackstops of adjacent active zones. As shown in FIG. 3: (i) the patterned Ni sublayer defines an Ni frame width and an Ni thickness; and (ii) the patterned PBO sublayer defines a PBO thickness (or, more generically, a protection sublayer thickness). These parameters will be further discussed, below, in the discussion of FIG. 2.

Some experimental data, shown in FIG. 2, will now be discussed. Wafers with the following parameters were built and tested in the T&H chamber for 500 hours: (i) Ni frame widths tested: 70 μm and 130 μm; (ii) Ni thicknesses tested: 10 μm and 20 μm; and (iii) PBO (polybenzoxazole layer) thicknesses tested: No PBO and 7 μm PBO. All fails were seen in the wafers with the wider 130 μm width Ni frame, leading to a conclusion that a wider frame accelerates failure faster. More particularly, some embodiments of this invention aim at determining the strength of the crackstop in an accelerated manner to reduce time needed for reliability qualification, which means that faster horizontal direction crack propagation, in prototype wafer assemblies made for crackstop testing purposes, is good. The proportion of fails was higher in wafers with PBO, leading to a conclusion that the presence of PBO accelerates fails faster. The proportion of fails was higher for wafers with greater Ni thickness, leading to a conclusion that the presence of thicker nickel accelerates fails faster.

A mechanical modeling summary will now be presented. A global-local modeling approach was used to obtain the ERR (Energy Release Rate) at the BEOL crack tip at various crack lengths during T&H. Model geometry was based on FA (Failure Analysis, FA is used to obtain the detailed dimensions of the structure) data. Some assumptions made in the mechanical modeling were as follows: (i) Ni Thickness (see FIG. 3): 10 um and 20 um; (ii) Ni Stress: 300 megapascals; (ii) vertical-crack-zone PBO sublayer 301 thickness=Ni thickness at the kerf region (based on FA); (iii) vertical-crack-zone PBO sublayer 301 width=~5 um (based on FA); (iv) Ni Frame Width: 70 um and 130 um; (v) Horizontal Crack Length: 5 um-28 um (distance from dicing edge the crack reaches this length before dicing but after laser scribing) to the crackstop structure being tested; and (vi) BEOL effective modulus: 35 gigapascals (minimum) and 85 gigapascals (maximum). The results of this mechanical modelling were as follows: (i) ERR increases with increases in frame width and/or effective modulus; (ii) predicted ERR at the crackstop during T&H for failed configurations is between 0.34-0.53 joules per square meter; (iii) predicted ERR at the crackstop at 25° C. for failed configurations is in the range of 1.10 to 1.75 joules per square meter; (iv) a plot of the proportion of fails against a maximum possible ERR for each configuration at 25° C. indicates increasing rate of failures with increasing ERR; and (v) this wafer level test method can be used to determine degradation of crackstop strength that occurs during T&H.

Figure 4:
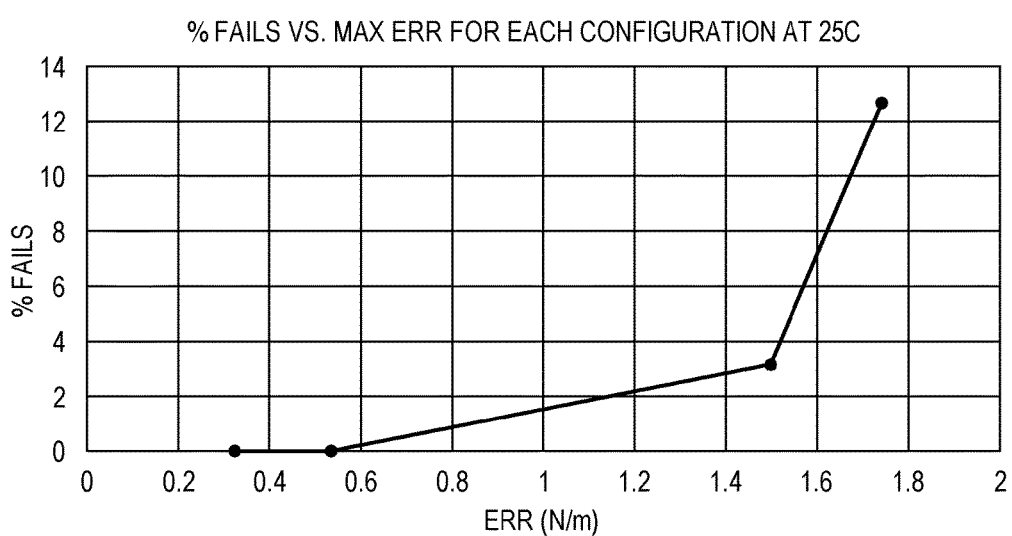
FIG. 4 is a graph showing data related to testing of semiconductor wafer assemblies.

Model versus test data will now be discussed. As shown in FIG. 4, graph 400 is a plot of a proportion of fails against maximum possible ERR for each configuration at 25° C. As will be appreciated by those of skill in the art, graph indicates an increasing rate of failures with increasing ERR. Both modeling results and experimental data indicate that the use of a tensioned layer can be used to accelerate crackstop failures at the wafer level.

Some embodiments of the present invention may include one, or more, of the following features, characteristics, operations and/or advantages: (i) a test vehicle to accelerate BEOL crack growth and to determine crackstop integrity at the wafer level; (ii) the test vehicle selectively accelerates only the cracks within the BEOL (that is, directed along the horizontal plane) and not the vertical cracks through bulk silicon; and/or (iii) patterning of the deposited film/coating only around the chip edge region allows wafer level probing and monitoring failures during testing (specifically testing performed before dicing but after laser scribing).

Some embodiments of the present invention may include one, or more, of the following features, characteristics, operations and/or advantages: (i) a wafer with patterned metal and/or polymer layers deposited around the edges of each die in a frame-like fashion and with at least one layer having a tensile residual stress at the testing temperature; (ii) the frame has cuts or breaks along the longitudinal direction of the edge; (iii) the width of the frame is greater than the distance between the diced edge of the die to the crackstop; and/or (iv) the total thickness of the frame is less than 50 um; (v) accelerated determination of weak BEOL/crackstop at an earlier wafer level stage will help in adopting chip design/fabrication process changes to rectify weak BEOL/crackstop regions early in the product cycle thereby reducing qualification time and costs; (vi) reduce unnecessary BA and capping related costs that could have incurred due to chips having defective BEOL/crackstop; and/or (vii) provides a methodology to determine the strength of the crackstop, compared to a known good wafer, and the weakest region within the crackstop at the wafer level in a time efficient manner.

Figure 5:
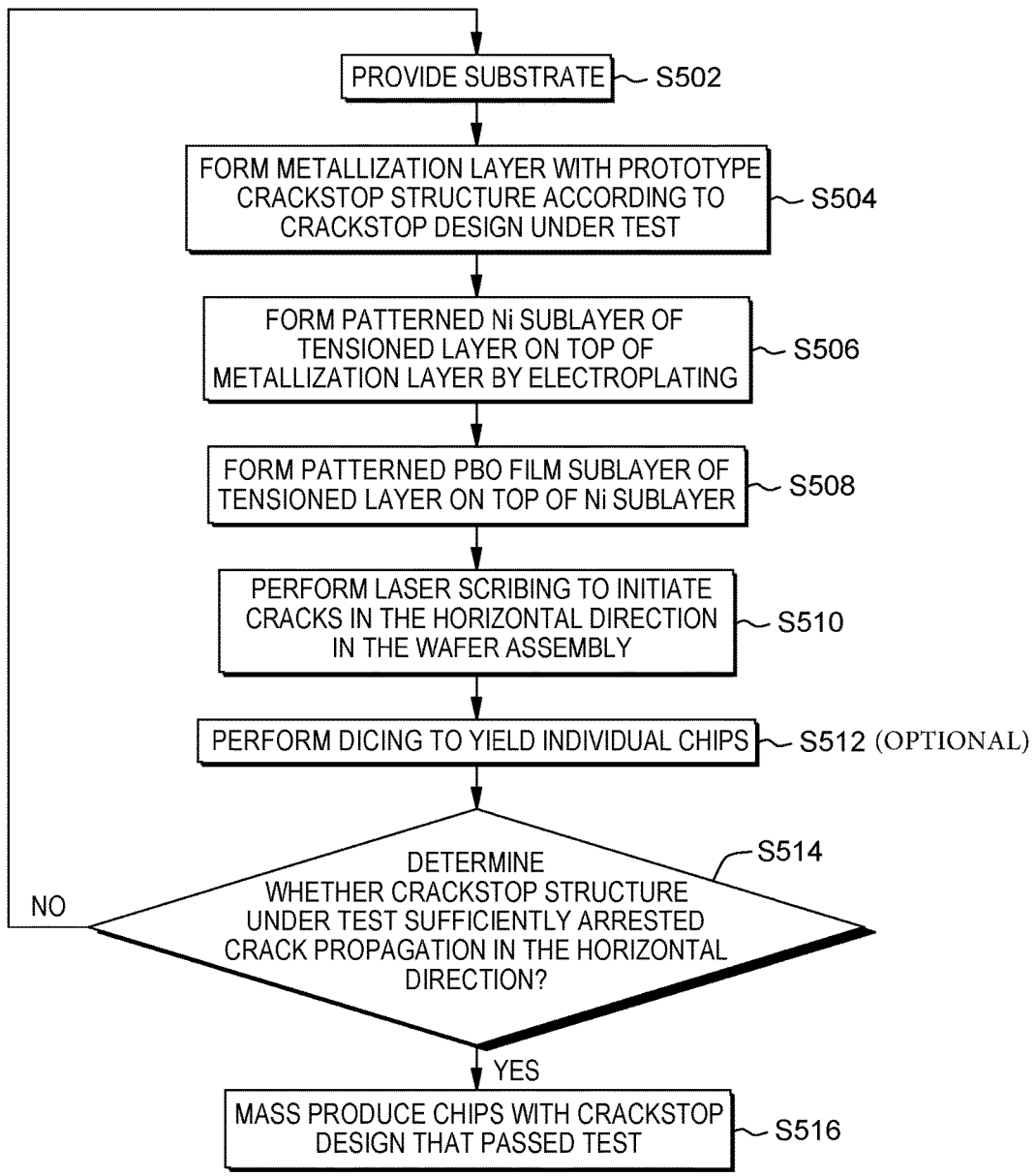
FIG. 5 is a flowchart of a process according to the present invention.

FIG. 5 shows process that begins with operation S502, where a substrate is provided. This substrate is a basis of a prototype wafer assembly that is to be used for testing, rather than for making actual integrated circuit chips to be sold to a mass market. The substrate may be any suitable type and/or geometry now known, or to be developed in the future. The substrate is generally flat and therefore defines what is herein referred to as horizontal directions (that is, the directions along the plane of the major faces of the substrate) and a vertical direction (that is, the thickness direction of the substrate). In this embodiment of process 500, only a simple prototype is being tested. Alternatively, multiple wafer assemblies may be made and tested at the same time, which may approve confidence in the data obtained from the testing of process 500.

Processing proceeds to operation S504 where a metallization layer is formed on top of the substrate layer. This metallization layer includes a crackstop structure (see, for example, FIG. 1A at reference numeral 112) whose design is being tested. The crackstop structure and metallization layer may be any types and/or formed by any processes now known or to be developed in the future. The crackstop structures are formed around the perimeter of areas of the metallization layer herein referred to as active chip areas. The zones in between the active chip areas of the metallization layer are sometimes herein referred to as interstitial zones of the metallization layer.

Processing proceeds to operation S506 where a patterned Ni sublayer is electroplated on top of certain portions of the metallization layer. More specifically, the Ni layer is patterned to be located over the interstitial zones and not over the active chip areas. This nickel layer is sometimes herein referred to as a nickel frame, or Ni frame layer. In this embodiment, the patterning further includes perforations running along the centers of the segments of the nickel frame in order to promote crack propagation in the vertical direction. Alternatively, the Ni layer could extend over the entire top surface of the metallization areas, including the active chip areas but with perforation gaps left to allow vertical direction crack propagation, but this type of embodiment would impede electrical testing of the wafer design. The nickel layer is electroplated such that it will have internal tensile stresses in the horizontal direction (that is, directed along the plane of the major faces of the Ni sublayer).

Processing proceeds to operation S508 where a patterned PBO sublayer is deposited on top of Ni sublayer. Together, the PBO sublayer and the Ni sublayer for the tensioned layer in this embodiment. As discussed above, in some embodiments, PBO is also deposited over the perforation gap zones in the nickel frame because this may be compatible with an acceptable frequency and rate of vertical direction crack propagation. Alternatively, the PBO layer could be formed from other polymers, so long as they are amenable to the generation and maintenance of internal tensile stresses. The PBO layer is cured such that it will have internal tensile stresses in the horizontal direction (that is, directed along the plane of the major faces of the PBO sublayer). Again, in this embodiment, the patterned PBO sublayer serves as what is more generically referred to as a protection sublayer. Alternatively, the protection sublayer may be made from other materials, as discussed, above.

Processing proceeds to operation S510 where laser scribing (in any manner now known or to be developed in the future) is performed on the wafer level semiconductor assembly built up over operations S502 to S508. The laser scribing initiates and propagates cracks in the plane of in wafer assembly (that is, the horizontal directions).

This laser scribing causes vertical and horizontal direction cracks which can damage chip active areas of the metallization layer if the crackstop structure is not designed to arrest them. More specifically, cracks caused by operation S510 propagate downwards from the top surface of the wafer level assembly (for example, along a perforation gap in the tensioned layer), and, after the vertical crack has propagated down for some depth, horizontal direction cracks form. As shown in FIG. 1A, above, it is the horizontal direction cracks that must be arrested by the crackstop structure before they extend into the chip active areas of the metallization layer and render the resulting chips inoperable. While crack propagation is normally seen as a negative thing, when testing crackstop designs, as here, it is actually a good thing because it helps determine the effectiveness of crackstop in an accelerated manner. As explained above, the tensile stresses internal to the tensioned layer assist in horizontal crack propagation (even though the horizontal cracks generally occur at some depth below the tensioned layer).

Processing proceeds to operation S512 where dicing is performed to separate the wafer level assembly into individual chips (with one chip corresponding to each active chip area of the metallization layer). In some embodiments, this dicing operation may be omitted, so long as the extent of horizontal crack propagation, relative to the crackstop structure locations, can be determined, by electrical testing or by other means, without dicing.

Processing proceeds to operation S514 where it is determined whether any horizontal direction cracks propagated past the crackstop structure being tested and into the chip active area(s). Those of skill in the art will appreciate that standards for determining the sufficiency of the crackstop structure may vary by application and application requirements. At this operation, the assistance with horizontal direction crack propagation provided by the tensioned layer helps make sure that the crackstop structure design has been thoroughly and robustly challenged so that it can be reliably used to determine whether the crackstop design is good enough for mass production. If it is, then processing proceeds to operation S516 with a new set of wafers with the acceptable crackstop designs, but without any tensioned layers deposited on top. If it is not, then processing loops back to operation S502 so that another crackstop structure design can be tested.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

What is claimed is:

1. A method of testing crackstop structure designs, the method comprising:
    providing a set of prototype wafer level semiconductor assembly(ies), with each wafer level semiconductor assembly including:
        a substrate structure shaped to define a set of horizontal directions,
        a metallization layer located on top of the substrate structure, with the metallization layer including a crackstop structure formed therein in accordance with a first crackstop structure design, and
        a tensioned layer located on top of the metallization layer, with the tensioned layer being made of material having internal tensile forces oriented in the horizontal directions;
    laser scribing each wafer level semiconductor assembly to initiate cracks in the horizontal directions, with the crack propagation being assisted by the horizontal tensile forces of the tensioned layer; and
    inspecting crack propagation in each wafer level assembly to determine whether the first crackstop structure design provides an acceptable level of crack suppression.

2. The method of claim 1, further comprising: subsequent to the laser scribing and prior to the inspection, dicing each semiconductor wafer level assembly.

3. The method of claim 1, wherein: the tensioned layer is: (i) not located over chip active areas of the metallization layer, and (ii) located over portions of the metallization layer in interstices between the chip active areas of the metallization layer; and the crackstop structures are located in the interstices between the chip active areas of the metallization layer.

4. The method of claim 3, wherein the tensioned layer is shaped to include perforations located and shaped to promote vertical direction crack propagation.

5. The method of claim 1, wherein the tensioned layer is a single unitary layer of material.

6. The method of claim 1, wherein the tensioned layer includes at least two sublayers of different materials.

7. A wafer level semiconductor assembly comprising:
    a substrate structure shaped to define a set of horizontal directions;
    a metallization layer located on top of the substrate structure, with the metallization layer including a crackstop structure formed therein in accordance with a first crackstop structure design; and
    a tensioned layer located on top of the metallization layer, with the tensioned layer being made of material(s) having internal tensile forces oriented in the horizontal directions.

8. The assembly of claim 7, wherein: the tensioned layer is so that it is: (i) not located over chip active areas of the metallization layer, and (ii) located over portions of the metallization layer in interstices between the chip active areas of the metallization layer; and the crackstop structures are located in the interstices between the chip active areas of the metallization layer.

9. The assembly of claim 8, wherein the tensioned layer is shaped to include perforations located and shaped to promote vertical direction crack propagation.

10. The assembly of claim 7, wherein the tensioned layer is a single unitary layer of material.

11. The assembly of claim 7, wherein the tensioned layer includes first and second sublayers of different materials.

12. The assembly of claim 11, wherein: the first sublayer is made of a polymer material; and the second sublayer is made of a metal material.

13. The assembly of claim 11, wherein: the first sublayer is located on top of the second sublayer.

14. The assembly of claim 11, wherein: the first sublayer is a protection film sublayer; and the second sublayer is made of nickel.

15. The assembly of claim 7, wherein the tensioned layer includes: a metal frame sublayer located on top of the metallization layer over interstitial areas between chip active areas of the metallization layer; a patterned polymer layer located on top of the metal frame sublayer; and a verticalcrack-zone polymer sublayer located in areas where it is desired to propagate vertical cracks in between the active chip areas of the metallization layer.

16. The assembly of claim 15, wherein: the patterned polymer sublayer and vertical crack-zone polymer sublayer are protection film sublayers; and the metal frame sublayer is made of nickel.

17. A method of making a prototype wafer level semiconductor assembly, the method comprising:

providing a substrate structure shaped to define a set of horizontal directions;

forming a metallization layer on top of the substrate structure, with the metallization layer including a crackstop structure formed therein in accordance with a first crackstop structure design; and forming a tensioned layer located on top of the metallization layer, with the tensioned layer being made of material having internal tensile forces oriented in the horizontal directions.

18. The method of claim 17, wherein the forming of the tensioned layer includes: electroplating a metal sublayer of the tensioned layer on top of the metallization layer; and depositing a polymer sublayer on top of the metal sublayer.

19. The method of claim 18, wherein: the polymer sublayer is a protection film sublayer; and the metal sublayer is made of nickel.

20. The method of claim 18, wherein the forming of the tensioned layer includes: curing the polymer sublayer to cause internal tensile forces in the polymer sublayer, wherein: the tensioned layer is: (i) not located over chip active areas of the metallization layer, and (ii) located over portions of the metallization layer in interstices between the chip active areas of the metallization layer; and the crackstop structures are located in the interstices between the chip active areas of the metallization layer.

* * * * *